(12) United States Patent
Liu

(10) Patent No.: US 6,211,508 B1
(45) Date of Patent: Apr. 3, 2001

(54) LENSLESS OPTICAL SYSTEM IN IMAGING SENSING MODULE

(75) Inventor: Dongtai Liu, Fremont, CA (US)

(73) Assignee: Syscan, Inc., San Jose, CA (US)

( * ) Notice: Subject to any disclaimer, the term of this patent is extended or adjusted under 35 U.S.C. 154(b) by 0 days.

(21) Appl. No.: 09/239,231

(22) Filed: Jan. 28, 1999

(51) Int. Cl.⁷ ................................................. H01L 27/00
(52) U.S. Cl. ...................... 250/208.1; 250/234; 358/484
(58) Field of Search .................. 250/208.1, 234, 250/235, 216, 227.11; 358/484, 471, 494–497, 475

(56) References Cited

U.S. PATENT DOCUMENTS 4,742,240 * 5/1988 Yamanishi et al. ............... 250/208.1
5,859,421 * 1/1999 Onishi et al. ..................... 250/208.1

* cited by examiner

Primary Examiner—Que T. Le
(74) Attorney, Agent, or Firm—Joe Zheng

(57) ABSTRACT

A lensless optical system comprises identical tubes that can be made and molded out of a plastic material. Each of the tubes includes an opening at the end that faces a scanning object. When the scanning object is illuminated and passes through the image sensing module, openings of all the tubes capture incident light reflected from the scanning object and the captured light passes the tubes and subsequently impinges onto the image sensor. An image of the scanning object is produced when the image sensor is activated.

19 Claims, 7 Drawing Sheets

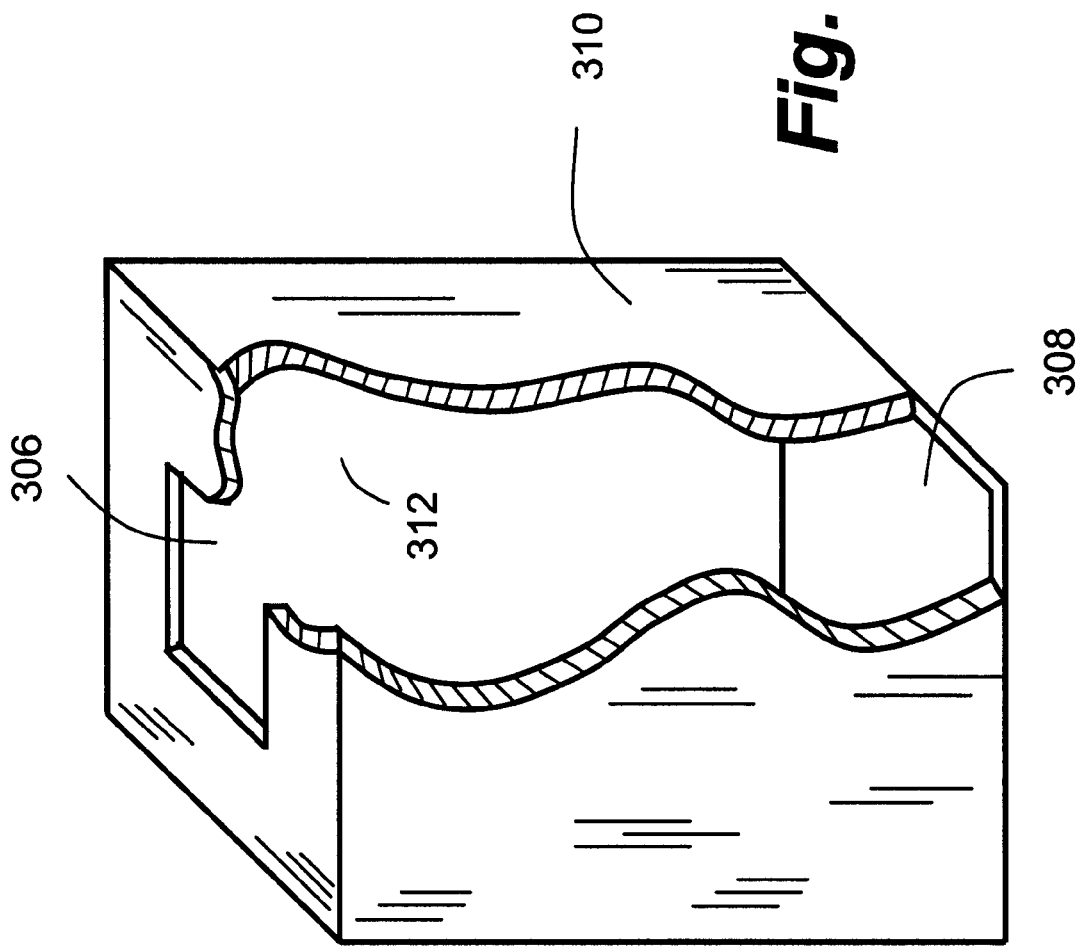

LENSLESS OPTICAL SYSTEM IN IMAGING SENSING MODULE

BACKGROUND OF THE INVENTION

1. Field of the Invention

The present invention generally relates to image sensing systems and more particularly relates to an image sensing module using a lensless optical system to produce digital images.

2. Description of the Related Art

It is not uncommon to see a whiteboard in every meeting room of a corporate in America. The whiteboard provides an informal medium for meeting attendees to communicate effectively and interactively. Like a scratch paper but more presentable, a whiteboard allows a speaker to use colorful markers to write, erase, draw, and modify what is being discussed and agreed upon among meeting attendees.

Whiteboards offer several advantages over chalkboards including a clean white surface which provides for greater contrast over the traditional green background of chalkboards. In addition, writing on a whiteboard is easier for many than on the traditional chalkboard. For example, the smooth writing surface of the whiteboard allows easy use of the erasable felt tip markers used on whiteboards, whereas the chalkboard surface provides a somewhat scratchy surface to hold the chalk used for writing on such surfaces. In addition, many users prefer a whiteboard to a chalkboard simply because the marker may be gripped easier than the chalk and does not mark the user's hand when gripped.

Recently, whiteboards have been developed to allow the user writings and notations entered upon the whiteboard to be printed or stored to a digital computer for storage, display and manipulation. A whiteboard, called Plus Boardfax, from Plus Corporation is designed to provide the capabilities to capture the information presented in the whiteboard. FIG. 1 illustrates an exemplary whiteboard 100. It includes a frame 102 and a rotatable canvas or writing surface (sheet) 104 for writing. When a page of writing is done, sheet 104 is caused to rotate towards an image scanning module 106 that is typically concealed in frame 102. As sheet 104 moves across image scanning module 106, marks or anything in writing are scanned by image scanning module 106 that subsequently generates an image thereof. The image can be then printed on a sheet of paper 108 by a concealed thermal printer for distribution or permanent record.

The basic principles of whiteboard 100 are the use of an image scanning module or system that comprises an image sensor, an optical lens and an illumination system. The image sensor comprises an array of photodetectors responsive to reflected light focused by the lens and from writing sheet 102. Each of the photodetectors produces an electronic signal representing the intensity of the reflected light. The electronic signals from all the photodetectors are then readout for printout or processing.

It can be perceived that the cost of the image scanning system goes up dramatically as the size of scanning width (i.e. the height of sheet 102) increases, so as the whiteboard 100. One of the factors in the cost is the complicated design of the optical system that must linearly focus light from sheet 102 onto the image sensor in the image scanning system. To reduce the cost of designing such optical system, multiple image scanning modules are sometimes used, namely each of the image scanning modules is responsible for a predefined area of sheet 102, signals from all the image scanning modules are then stitched together to form a complete signal for subsequent processing and output. Nevertheless, the use of multiple image scanning modules introduces a complicated process of aligning all the multiple image scanning modules, namely image scanning modules must be aligned precisely to avoid overlapping between two adjacent image scanning modules so as to alleviate data analysis and processing due to the overlapping. There is, therefore, a desire to have a cost-effective optical system in an image scanning system so that there would be no need for multiple image scanning modules.

One of the benefits and advantages of the whiteboard over the traditional chalkboard is the use of powderless markers, and the whiteboard has begun to appear in education facilities and even in many families for children's educational activities. Further the whiteboard can potentially be used for discussion between two people and generates images to be reviewed by a third party in a remote site through the Internet. With the increased applications and popularity of the whiteboard, there is indeed a great demand for a low-cost image scanning system that can be used in applications like the whiteboard.

SUMMARY OF THE INVENTION

The present invention has been made in consideration of the above described problems and needs and has particular applications to recordation of a large presentational board, such as whiteboards in educational and meeting facilities. Employing the current invention, the cost of the electronic presentational boards can be dramatically reduced so as to enhance the popularity of such boards. It will become apparent to those skilled in the art that the present invention may be utilized in many image sensing modules that do not have to produce high resolution images but are demanded of low cost.

According to one aspect of the present invention, an image sensing module comprises an image sensor and a plurality of tubes closely affixed together in parallel and mounted above and sufficiently covering the image sensor. All of the tubes are identical and can be made and molded out of a plastic material. Each of the tubes includes an opening at the end that faces a scanning object. When the scanning object is illuminated and passes through the image sensing module, openings of all the tubes capture incident light reflected from the scanning object and the captured light passes the tubes and subsequently impinges onto the image sensor. An image of the scanning object is produced when the image sensor is activated.

The lensless optical system disclosed herein works perfectly for those applications that provide sufficient illumination and require no high resolution images. The whiteboard application demanding the imaging capabilities is one of the examples in which the present invention can be practiced. The advantages and benefits of the image sensing module employing the lensless optical system are numerous, one of which is the cost that is now significantly reduced comparing to the traditional lens-based optical system. Another one may be appreciated to those skilled in the art that the cost of the lensless optical system is not directly related to the size thereof. Typically the size of an optical system is one of the factors that determines the cost while the size in the present optical system is no longer the factor as the lensless optical system is simply made with an array of plastic tubes.

According to another aspect of the present invention, each of the tubes has an inner wall surface that is preferably dark and of rough surface. The reason behind the design features is to minimize possible ambient light coming through the openings of the tubes to affect the image sensor.

Objects and other advantages and benefits, together with the foregoing are attained in the exercise of the invention in the following description and resulting in the embodiment illustrated in the accompanying drawings.

BRIEF DESCRIPTION OF THE DRAWINGS

These and other features, aspects, and advantages of the present invention will become better understood with regard to the following description, appended claims, and accompanying drawings where:

FIG. 3B shows an exploded view of one of the hollow short tubes used in the lensless optical system in FIG. 3A;

DETAILED DESCRIPTION OF THE PREFERRED EMBODIMENTS

In the following detailed description of the present invention, numerous specific details are set forth in order to provide a thorough understanding of the present invention. However, it will become obvious to those skilled in the art that the present invention may be practiced without these specific details. The description and representation herein are the common means used by those experienced or skilled in the art to most effectively convey the substance of their work to others skilled in the art. In other instances, well known methods, procedures, components, and circuitry have not been described in detail to avoid unnecessarily obscuring aspects of the present invention.

There are many applications that need an imaging system to convert a target to an electronic format that can be subsequently analyzed, printed, distributed or archived. The electronic format is generally a digital image of the target. A typical example of the imaging system is a scanning system in a whiteboard that converts the whiteboard to an image including marks written thereon. The image can be printed on site or transmitted to a remote site for review via the Internet.

It is understood that the image scanning module in applications like the whiteboard does not have to be precise or of high resolution. Most applicable writing instrument designed for the whiteboards are markers using colored water ink and those markers leaves a trace of nearly a quarter of an inch in width in order to be legible from a certain distance. To convert everything written on a whiteboard into an image of a limited size for subsequent printing in a sheet of standard sized paper, the imaging requirement in such module is different from that in a flatbed scanner or facsimile machine that requires a precise or relatively high resolution image scanning module. Typically, the image resolution in the whiteboard application is low, no more than 50 dpi (dot-per-inch) versus 300+ dpi in a flatbed scanner or facsimile machine. The resolution difference together with nearly unlimited illumination power in the whiteboard application, however, provides a complete new design.

Figure 2:
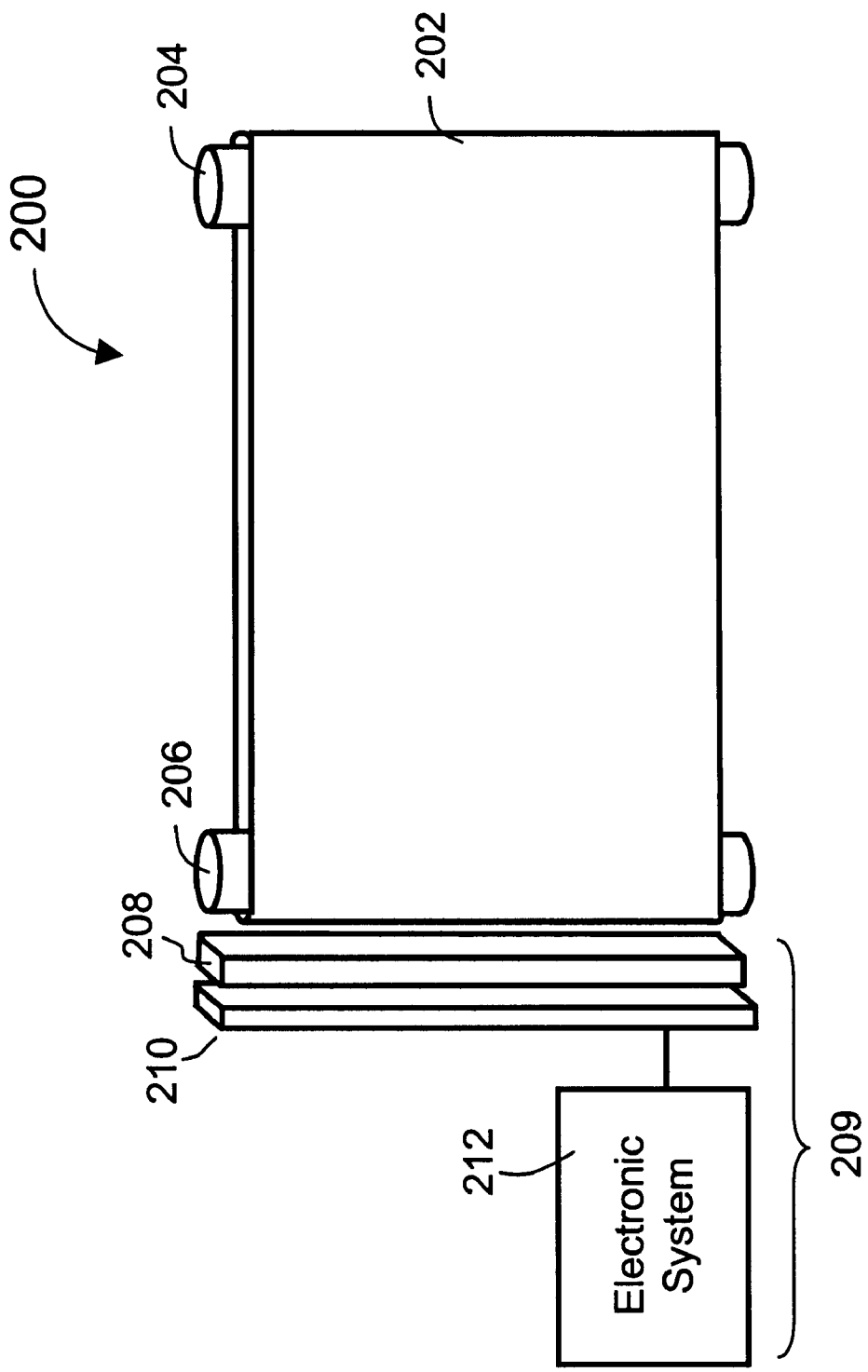
FIG. 2 illustrates a simplified systematic diagram in which the present invention is practiced.

Referring now to the drawings, in which like numerals refer to like parts throughout the several views. FIG. 2 illustrates a simplified systematic diagram 200 in which the present invention is practiced. Canvas or writing sheet 202 is a substrate on which a marker can leave a trace of movement. If a presenter writes words or draws figures using a marker in color, the words or figures stays on sheet 202 and are legible from a distance. Typically sheet 202 is flexible and can be caused to rotate from one side to another. In other words, when one side of sheet 202 is done, sheet 202 is driven by a pair of shafts 204 and 206 to cause the other side of sheet 202 to be available for writing. It is known to those skilled in the art that a motor, not shown in the figure, is used to drive the pair of shafts 204 and 206 and typically controlled and synchronized with image sensing module 209.

As sheet 202 rotates, optical system 208 captures reflected light from sheet 202 and impinges the reflected light onto image sensor 210 that produces electronic signals thereof. Not shown in the figure is an illumination source that may be powerful cold cathode fluorescent lamp or other high intensity light source. It should be noted that a high powerful lighting source can be provided because there is sufficient space and power to support such lighting source in system 200, which is not possible in many flatbed scanners or facsimile machines.

Electronic system 212, coupled to image sensor 210, receives the electronic signals from image sensor 210. It comprises an A/D converter converting the electronic signals into digital signals. Optionally, electronic system 212, coupled to the Internet, may comprise signal processing circuits that compresses the digital signals and transmits the compressed signals to a remote site through the Internet. Other functions electronic system 212 may include, but not be limited to, are optical character recognition, data analysis and signal processing for proper output; such as to a printer, memory, storage, or remote sites by electronic communications.

Figure 3A:
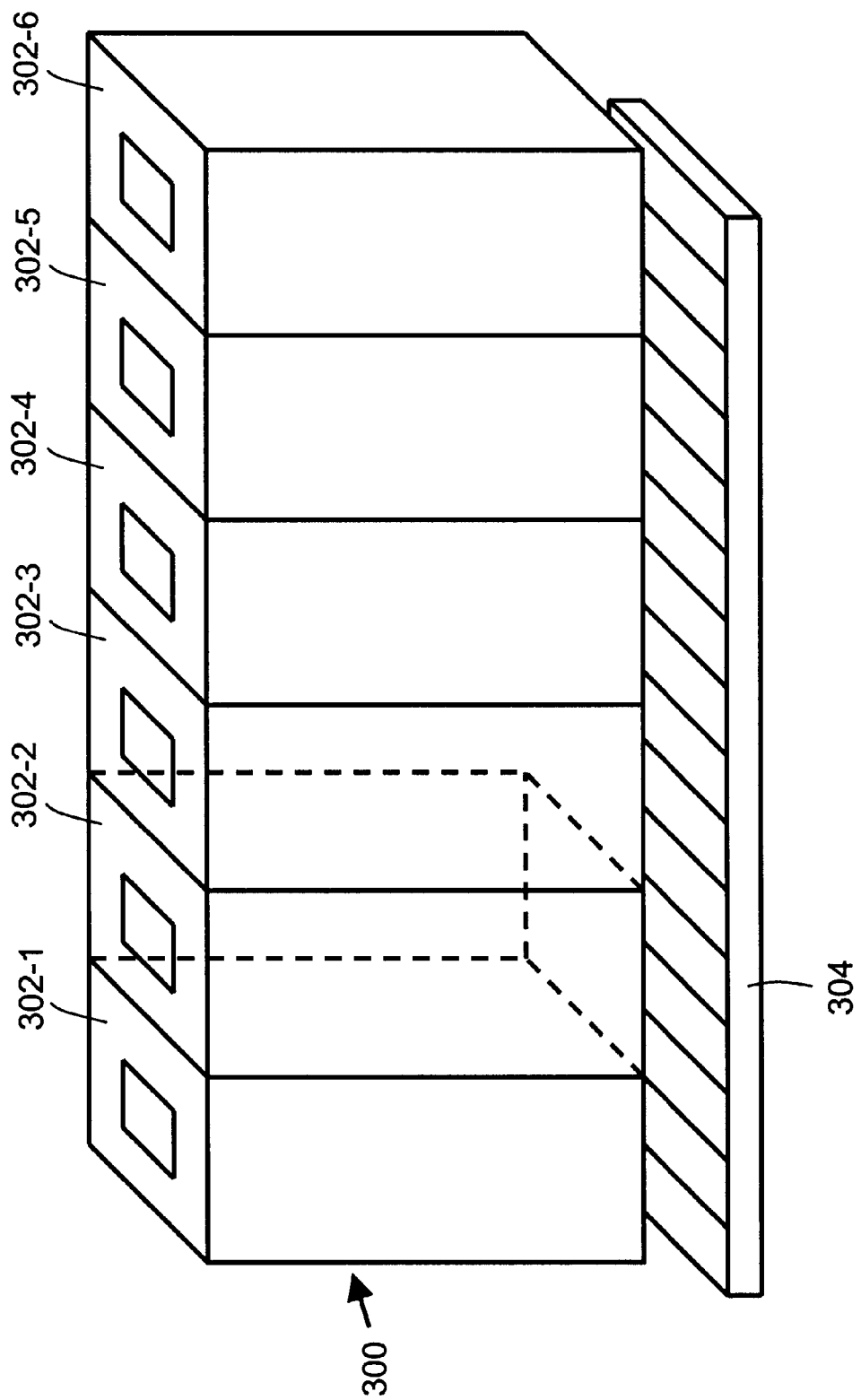
FIG. 3A demonstrates an image sensing portion including a lensless optical system according to one embodiment of the present invention.

FIG. 3A demonstrates a lensless optical system 300, a shorten version, according to one embodiment of the present invention. Lensless optical system 300, when rotated 90 degree clockwise, may correspond to optical system 208 of FIG. 2. Lensless optical system 300 is preferably made or molded out of a plastic material.

To be more specific, optical system 300 comprises a plurality of short tubes 302. According to one embodiment, the shape of tubes 302 are preferably of square, so that all tubes 302 can be maximally affixed together in parallel over an image sensor 304. To image an area, tubes 302 may be structured in two-dimension so that reflected light from the area can be captured and passed to impinge onto an area image sensor.

When optical system 300 is used for a whiteboard application, tubes 302 are affixed to together in a line fashion. It should be pointed out that a line fashion does not necessarily mean that tubes 302 are structured one-to-one along a line. It can be appreciated that two or more rows of tubes are still considered as the line fashion. In reality, the number of rows to use largely depends on the size of the underlying image sensor array and the tubes. In other words, if the photodetectors in the image sensor array turn out to be of large size for higher sensitivity and the tubes are thin, multiple rows of tubes are preferably used to better use the photodetectors in the image sensor array. In one embodiment, the tubes are affixed together and sufficient to cover the image sensor array.

In the whiteboard application, the length of optical system 300 is approximately close to the height of the whiteboard. As described above and will be further described below, those skilled in the art will appreciate that the cost of optical system 300 does not dramatically increase when the length thereof is increased. Unlike the lens-based optical system, lensless optical system 300 is simply made out of rows of hollow short tubes. Further there is no particular requirement for special characteristics of the material except a few design constraints that should be followed in order to obtain satisfactory image quality applicable to certain applications such as the whiteboard application.

Referring now to FIG. 3B, there is shown an exploded view of one of the hollow short tubes used in optical system 300 of FIG. 3A. Optical tube 304 includes an opening 306 that is typically smaller than the size of the crossing section (shape) of tube 304. As used herein, a crossing shape means the shape of the crossing section. Particularly, the crossing shape of tube 304 illustrated in FIG. 3B is of square. Other crossing shapes are possible, such as a rectangle or a circle.

Typically the area of opening 306 is about 10% of the area of the crossing shape. More specifically, according to one embodiment of the present invention, tube 304 is of 0.25 inch high and the crossing section is 0.025 by 0.025 inches, then the area of opening 306 may be made roughly 0.00079 by 0.00079 inches if it is a square opening or 0.00046 inch in radius if it is a round opening. Optically, the smaller the opening is, the sharper image may be resulted from. However, by the description herein, those skilled in the art can appreciate that opening 306 should not and does not have to be too small. According to another embodiment, opening 306 is made the same size or shape as the crossing section of the tube.

Further inside wall surface 312 of tube 304 is preferably of rough surface and dark as well. The purpose is to deflect or defuse any ambient light coming through opening 306 and minimize the ambient light to a minimum before it reaches an image sensor under tube 304. To be precisely, as shown in FIG. 2, an array or line of the identical tubes are affixed together in parallel, long enough to cover and mounted above an image array. With the openings of the tubes facing a scanning object illuminated by a lighting source, light reflected from the scanning object is collected by the openings of the tubes and impinged through the tubes onto the image sensor. An image or a scanning signal of the scanning object is generated from the image sensor when the image sensor is activated to operate.

Figure 4A:
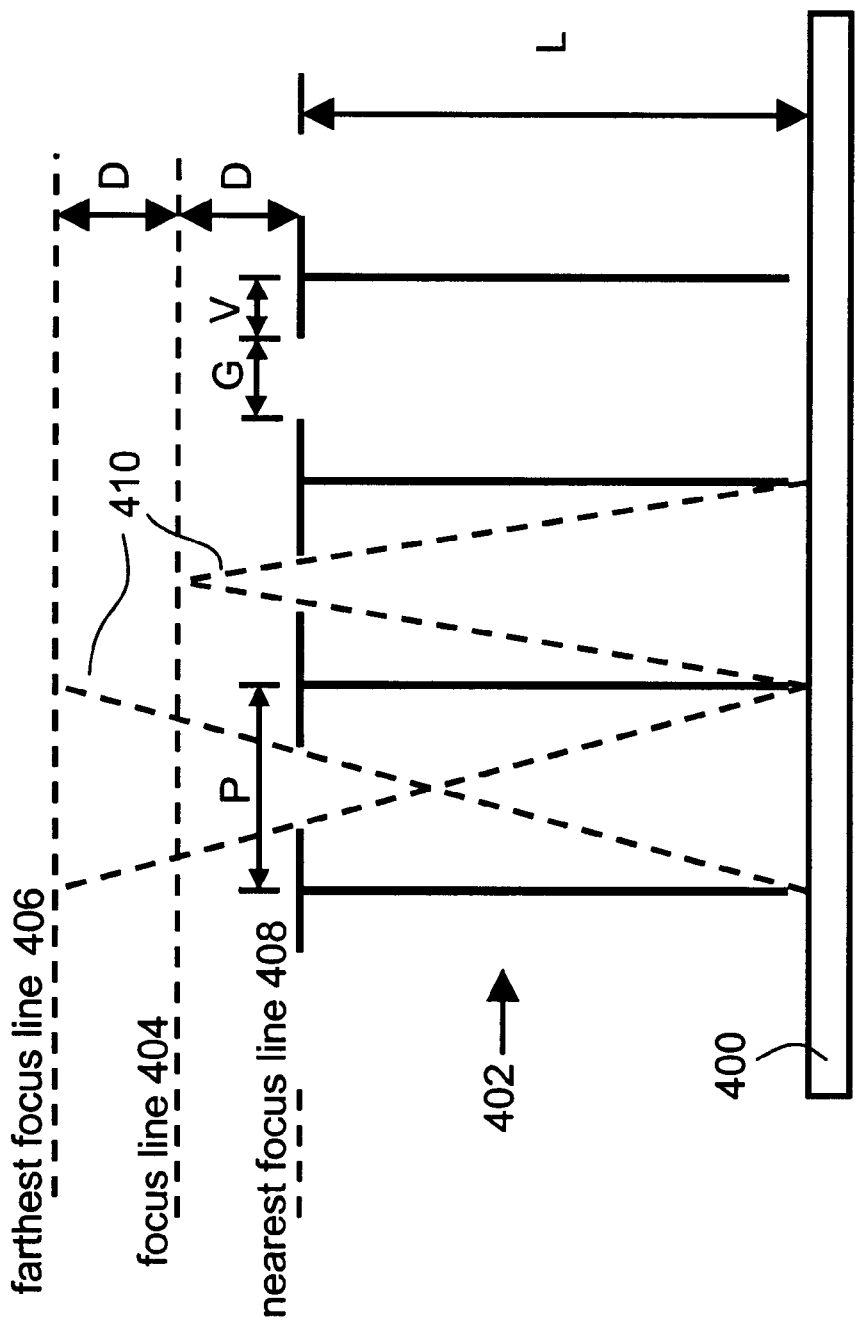
FIG. 4A depicts optical paths in the lensless optical system.

FIG. 4A shows the optical path through lensless optical system 300 of FIG. 3A. Image sensor 400 is under an array of tubes 402. In the case that a color image is desired, image sensor 400 is a color image sensor, namely photodetectors are respectively coated or superimposed with individual filters. The filters are generally in three complimentary colors, such as red, green and blue, so that the photodetectors respond to the respective color components in the incident light from a scanning object. Preferably, each tube is in registration with at least three photodetectors coated With three distinct filters so that colors can be properly reproduced in resultant images.

The distance P between the inner walls of each tube is called tube pitch that generally dictates the crossing size of a tube. The distance G between the edges of the tube openings is called gate width and dictates the size of the openings and further controls the depth of field D of the image sensing module. As shown in the figure, focus line 404 is perfectly on focus with an opening of predetermined size. The depth of field D provides the measurement, namely an object beyond the distance D will not be focused by the optical system. It can be seen that height L of the tube is a function of the size of the opening G and focal distance D.

The following relationships can be approximated; for case in which P=G+2V:

$$L=D(1/R-1);$$

for case in which P=G:

$$L=2D/R;$$

wherein R=V/P; referred to as a maximum overlap ratio. In other words, given design requirements, the structure of the lensless optical system is determined. In addition, optical paths 410 and 412 illustrate two situations, one being exactly on focus line 404 and the other being on furthest focus line 406.

Figure 1:
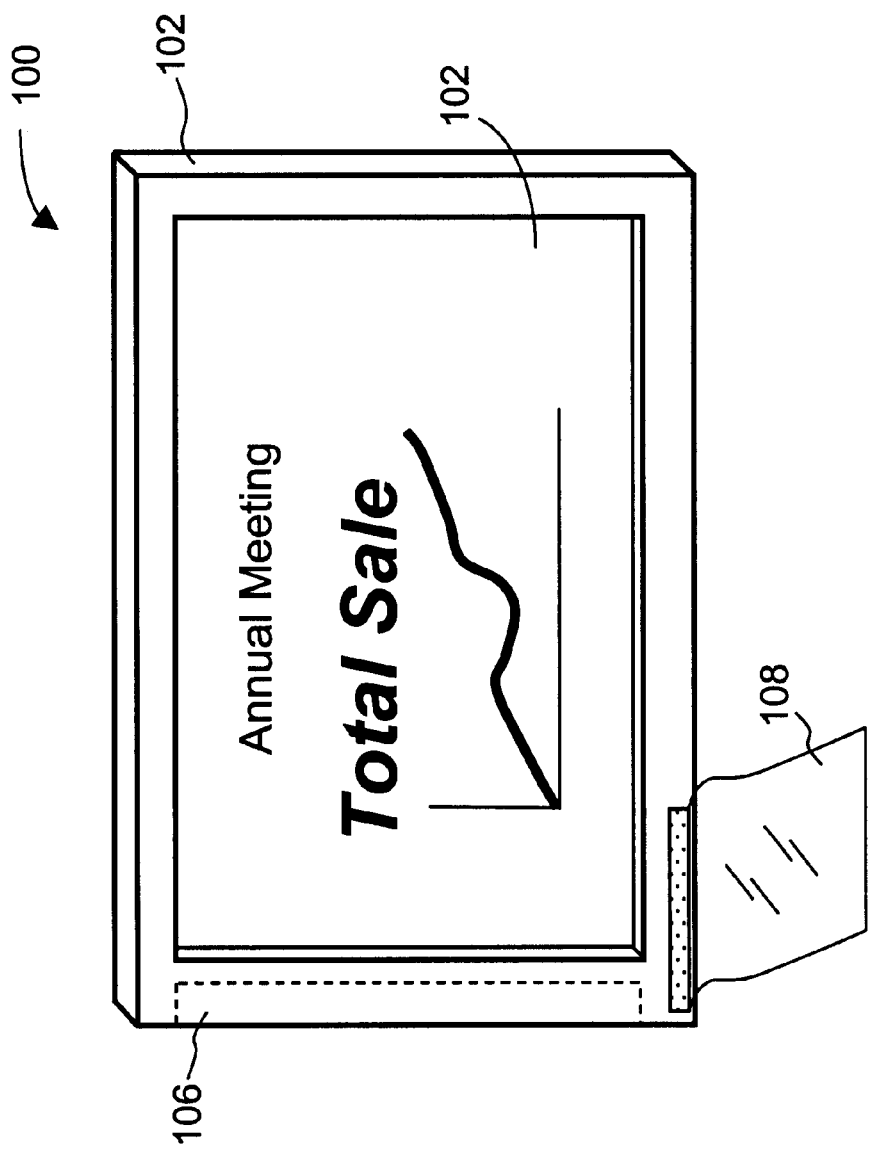
FIG. 1 depicts an exemplary whiteboard.
Figure 4B:
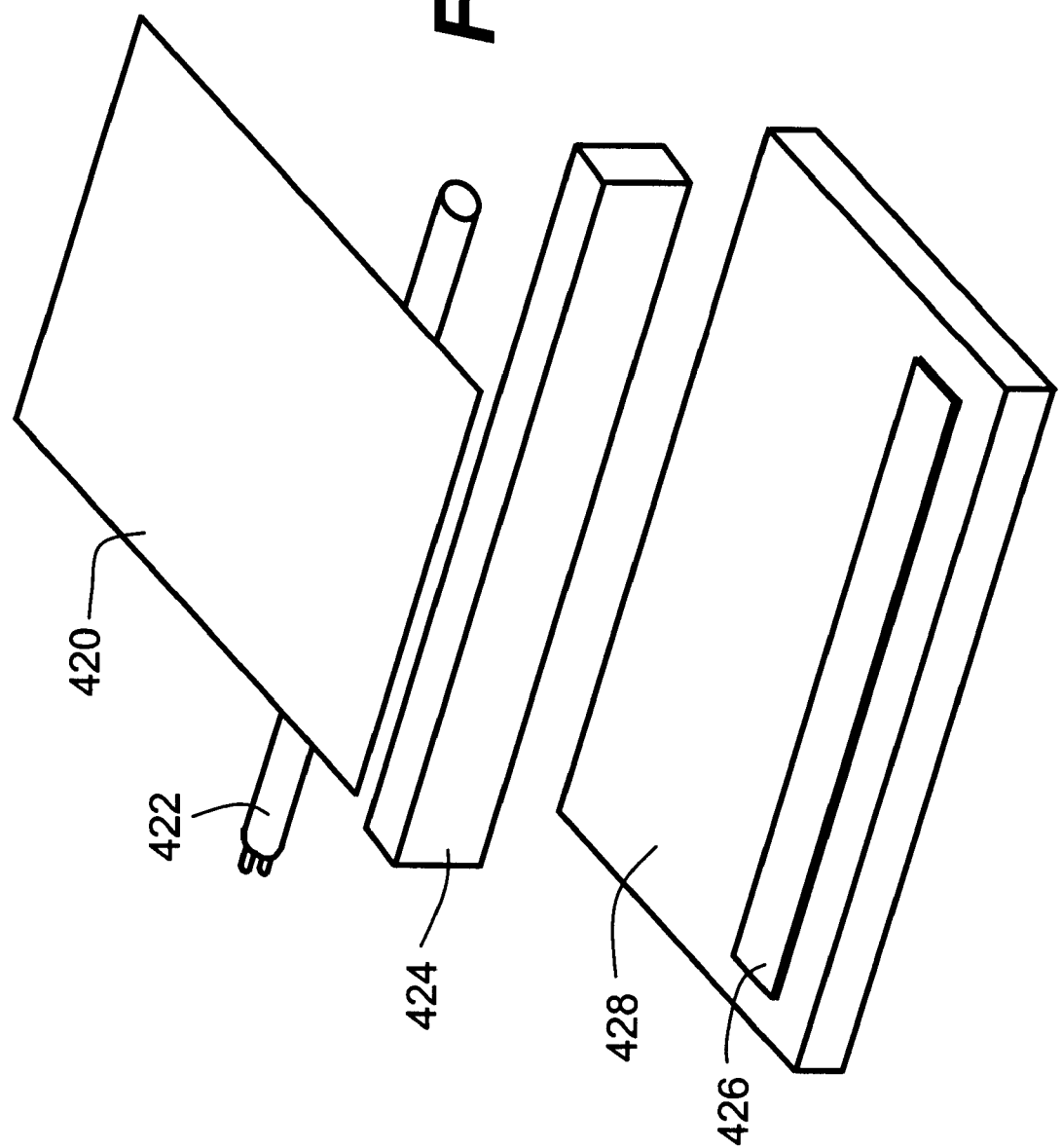
FIG. 4B depicts an internal structure of an image scanning system using the disclosed lensless optical system.

FIG. 4B depicts an internal structure of an image sensing system in which the lensless optical system is used. Scanning surface 420 is illuminated by an illumination source 422. Scanning surface 420 can be writing sheet 102 of FIG. 1 and rolled over or passed through by a moving mechanism. Reflected light from scanning surface 420 is collected and focused by a full-width array of optical tubes 424, such as an array of tubes 300 of FIG. 3A. The image sensing system allows a full length scanning of scanning surface 420 because optical tubes 424 and an image sensor chip 426 are of the same width as (or greater width than) scanning surface 420.

Figure 5:
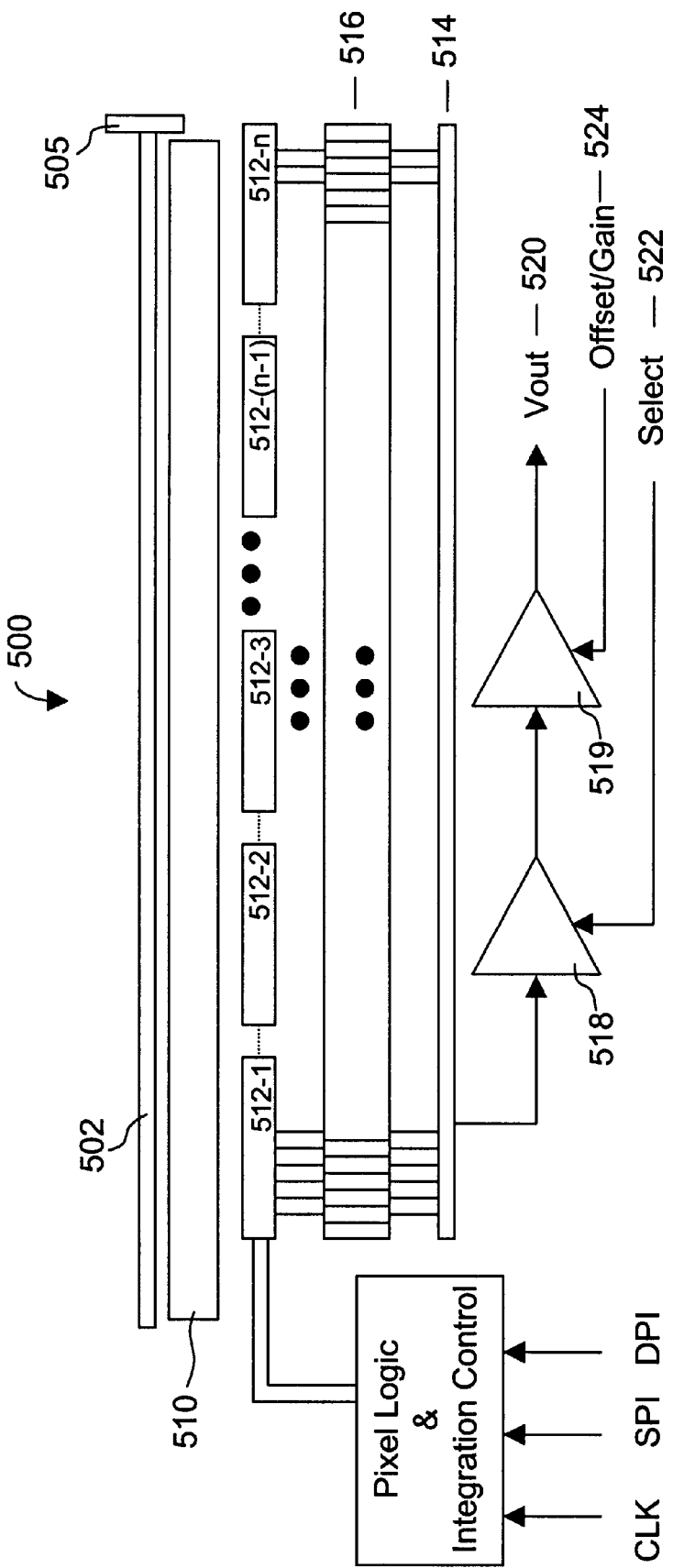
FIG. 5 shows an internal functional diagram of an image sensing module according to one embodiment of the present invention.

To further understand the principles of the present invention, FIG. 5 shows an internal functional diagram of sensing module 500 according to one embodiment of the present invention. As illustrated, there is an elongated light pipe 502 that is preferably a cold cathode fluorescent lamp or excited by a point light source 505 to provide a fairly even illumination. When in operation, light pipe 502 is turned on to illuminate the passing scanning object, such as the writing sheet, so that light reflected from the scanning object is captured by optical system 510.

Optical system 510 collects incident light from the scanning object illuminated by light pipe 502 and impinges the incident light onto image sensor 512. Image sensor 512 comprises a number of small image sensors concatenated together to cover the whole width of the scanning object. For example, a whiteboard has a height of 36 inches (writing sheet), image sensor 512 is typically that long. Traditionally, an image sensor having that size would be beyond an acceptable cost. However, what makes the present invention to work effectively is the vast reduction in the underlying imaging process. For example, for a width of 36 inches to 8 inches (width of U.S. standard paper size), the image reduction is 4 times. Further, the mark trace by the markers is so thick, the pixel (photodetector) resolution of the image sensor can be as coarse as 50 per inch. Therefore, the image sensor of that length is in fact of very low cost, considering equipment and processed involved otherwise to produce the precise and high resolution image sensors.

Each of the photodetectors in the image sensor collects light cast thereupon during each light integration process and generates a charge signal. Upon the completion of the integration process, the charge signals, each respectively generated by one of the photodetectors, are sequentially readout as a scanning (analog) signal via readout switch array 516 controlled by control signals from the control signals circuitry. It should be noted that image sensor 512 is assumed a CMOS type sensor and those skilled in the art will understand that the description works the same for CCD type sensors.

Switch array 516 comprises the same number of the readout switches as the number of the photodetectors in image array 512. It is understood to those skilled in the art that each of the readout switches may be implemented by a diode that becomes "On" or "passing through" when a proper voltage is applied across.

As shown in the figure, the scanning signal is received in an amplifier 518 that amplifies the scanning signal according to a gain controlled by a select signal 522. Processing circuitry 619 may perform further adjustment with respect to a desired adjustment and subsequently output as a signal $V_{out}$ ready for being digitized in an A/D converter.

The present invention has been described in sufficient detail with a certain degree of particularity. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the forgoing description of embodiments.

I claim:

1. An image sensing module comprising:
   an image sensor;
   a plurality of identical hollow tubes closely affixed together in parallel and mounted above and sufficiently covering the image sensor; each of the hollow tubes including an opening at one end facing a scanning object; and
   wherein reflected light from the scanning object is collected by the openings of the tubes and impinged through the hollow tubes onto the image sensor that produces an image of the scanning object when the image sensor is activated.

2. The image sensing module as recited in claim 1; wherein each of the hollow tubes has a crossing shape being of square so that each of the hollow tubes has maximum contact surfaces to be affixed together in parallel.

3. The image sensing module as recited in claim 2; wherein the opening of each of the hollow tubes is identical to the crossing shape of the each of hollow the tubes.

4. The image sensing module as recited in claim 2; wherein an area of the opening of each of the hollow tubes is smaller than an area of the crossing shape of the each of the hollow tubes.

5. The image sensing module as recited in claim 4, the opening of each of the hollow tubes is of square.

6. The image sensing module as recited in claim 4, the opening of each of the hollow tubes is circular.

7. The image sensing module as recited in claim 1; wherein the hollow tubes are made and molded out of a solid material.

8. The image sensing module as recited in claim 7, wherein the solid material is a plastic material.

9. The image sensing module as recited in claim 1; wherein each of the hollow tubes has a rough inner wall surface so that ambient light coming through the opening is diffused in the each of the hollow tubes.

10. The image sensing module as recited in claim 8; wherein the inner wall surface in each of the hollow tubes is so dark that the ambient light is absorbed to a minimum before the ambient light reaches the image sensor.

11. An image sensing module comprising:
    an array of photodetectors having an array length long enough to cover an entire width of a scanning object;
    an elongated lensless optical system having a length enough to cover the entire width of the scanning object; the optical system mounted in front of the array of photodetectors and comprising a plurality of identical hollow tubes affixed together in parallel; each of the hollow tubes having an opening facing the scanning object; and
    wherein the opening of each of the hollow tubes captures incident light reflected from the scanning object illuminated by an illumination source; the incident light passes the hollow tubes and impinges upon the array of photodetectors that generates electronic signals representing the incident light.

12. The image sensing module as recited in claim 11, wherein the opening of each of the hollow tubes is identical to inner shape of the each of the hollow tubes.

13. The image sensing module as recited in claim 11; wherein each of the hollow tubes has an inside wall surface, the inside wall surface is so dark that ambient light coming through the opening can be absorbed to a minimum before the ambient light reaches the array of photodetectors.

14. The image sensing module as recited in claim 13; wherein the inside wall surface is of rough surface so that the ambient light is deflected.

15. The image sensing module as recited in claim 14; wherein each of the hollow tubes has a crossing shape being of square.

16. The image sensing module as recited in claim 15; wherein the opening of each of the hollow tubes is of round shape.

17. The image sensing module as recited in claim 15; wherein the opening of each of the hollow tubes is of square shape.

18. The image sensing module as recited in claim 14; wherein each of the hollow tubes has a crossing shape being of circle.

19. The image sensing module as recited in claim 18; wherein the opening of each of the hollow tubes is of round shape.

* * * * *